United States Patent [19]

Kitazawa et al.

[11] Patent Number: 4,899,309
[45] Date of Patent: Feb. 6, 1990

[54] CURRENT SENSE CIRCUIT FOR A ROM SYSTEM

[75] Inventors: Shooji Kitazawa; Hiroshi Kuwabara; Teruhiro Harada, all of Tokyo, Japan

[73] Assignee: Oki Electric Co., Ltd., Tokyo, Japan

[21] Appl. No.: 225,374

[22] Filed: Jul. 28, 1988

[30] Foreign Application Priority Data

Aug. 3, 1987 [JP] Japan ................................ 62-194257

[51] Int. Cl.$^4$ ........................ G11C 7/00; G11C 11/40; H03F 3/45
[52] U.S. Cl. ........................... 365/189.01; 365/189.09; 365/207; 365/208; 365/206; 307/530
[58] Field of Search ...................... 365/189.01, 189.07, 365/189.09, 190, 205, 206, 207, 208; 307/530

[56] References Cited

U.S. PATENT DOCUMENTS

| | | | |
|---|---|---|---|
| 4,425,632 | 1/1984 | Iwahashi et al. | 365/189.09 |
| 4,592,021 | 5/1986 | Suzuki et al. | 365/203 |
| 4,654,831 | 3/1987 | Venkatesh | 365/207 |
| 4,709,352 | 11/1987 | Kitazawa | 365/104 |

Primary Examiner—Stuart N. Hecker
Assistant Examiner—Alyssa H. Bowler
Attorney, Agent, or Firm—Spencer & Frank

[57] ABSTRACT

In a current sense circuit for detecting a read current from a selected memory cell in a memory cell matrix of a ROM, each of a first series circuit and a second series circuit comprises: a current supply means having a first main electrode connected to a power supply; a first MOS FET having a first main electrode connected to the second main electrode of the current supply means; and a second MOS FET having a first main electrode connected to the second main electrode of the first MOS FET, a second main electrode connected to a second power supply, and a gate electrode connected to the first main electrode of the first MOS FET. The gate electrode of the first and the second MOS FETs of the reference voltage generator are connected together; the gate electrodes of the first MOS FETs of the first and second series circuits are connected together; and the ratio of the current driving capability between the first MOS FET of the first series circuit and the first MOS FET of the second series circuit is substantially equal to the ratio of the current driving capability between the second MOS FET of the first series circuit and the second MOS FET of the second series circuit.

8 Claims, 3 Drawing Sheets

CURRENT SENSE CIRCUIT FOR A ROM SYSTEM

BACKGROUND OF THE INVENTION

This invention relates to a current sense circuit for detecting read current from a memory cell in a ROM (Read-Only Memory) device such as a mask ROM (mask Read-Only Memory), EPROM (Erasable Programmable Read-Only Memory), and EEPROM (Electrically Erasable Programmable Read-Only Memory).

Read-only memory devices (hereinafter called ROMs) generally take much longer access time than other types of memory devices. To improve the access speed of ROMs by increasing the rate of signal propagation on the word lines, the inventor has proposed a ROM, described in Japanese Patent Application Laid-open 1986/123000, in which the bias of the memory elements is opposite to that employed previously, and a current sense circuit, described in Japanese Patent Application Laid-open 1986/129800, in which the current inflow from the selected data line is detected. The U.S. Pat. No. 4,709,352, which claims the Convention Priority from these two Japanese applications, discloses the above features.

FIG. 1 is a schematic diagram of the aforesaid current sense circuit. This current sense circuit comprises a pair of identical depletion-type MOS field-effect transistors (hereinafter referred to as MOS FETs) 1 and 2, a pair of identical enhancement-type MOS FETs 3 and 4, and a pair of identical enhancement-type MOS FETs 5 and 6. The MOS FETs 1, 3, and 5 are connected in series between the high supply voltage Vcc and the low supply voltage Vss, and their gates are connected in common to the source of the MOS FET 1. The MOS FETs 2, 4, and 6 are also connected in series between the high supply voltage Vcc and the low supply voltage Vss, and the gates of the MOS FETs 2 and 6 are connected in common to the source of the MOS FET 2. The gate of the MOS FET 4 is connected to the gate of the MOS FET 3.

A reference current Ir is supplied to a node N1 disposed between the source of the MOS FET 3 and the drain of the MOS FET 5. A read current I representing a bit of data to be read is supplied to a node N2 disposed between the source of the MOS FET 4 and the drain of the MOS FET 6. A node N3 disposed between the source of the MOS FET 1 and the drain of the MOS FET 3 and a node N4 disposed between the source of the MOS FET 2 and the drain of the MOS FET 4 are connected to two input terminals 8a and 8b of a differential amplifier 8 which provides the amplified difference of their potentials to an output circuit, not shown. The potentials at the nodes N3 and N4 are indicative of the current inputs I and Ir.

In the current sense circuit, the potentials at the nodes N1 and N2 are held to constant values determined by the circuit parameters and the reference current Ir, so it can quickly correct potential fluctuations due to switching from one bit to another, permitting high-speed read access. In other words, the above-described current sense circuit should be distinguished from a voltage sense circuit which detects the voltage variation on the data line which varies depending on the read data bit. Rather, the above-described current sense circuit maintains the potential of the data line and instead detects the current through the data line which varies depending on the read data bit. This scheme is advantageous because it permits high-speed reading.

One of the requisite conditions for the above described circuit to operate successfully is that the value of the reference current Ir must be substantially midway between the two values of the read current I. When the read data bit is "0", the read current is a smaller value $I_S$ which is about 0 to 20μA. When the read data bit is "1", the read current is a larger value $I_L$ which is about 50 to 70μA. The reference current Ir must therefore be set about 35μA. It is difficult to provide this small current with a high reliability and a good stability. In this connection, it must be noted that the actual value of the read current I ($=I_L$ or $I_S$) varies in a nonlinear fashion with fluctuations in the supply voltage Vcc. ROMs using this current sense circuit therefore have a small noise margin; fluctuations in the power supply tend to cause read-out errors.

SUMMARY OF THE INVENTION

An object of the present invention is to provide a current sense circuit for a ROM that operates correctly despite fluctuations in a supply voltage.

According to the invention, there is provided a current sense circuit for a ROM for detecting a read current from a selected memory cell in a memory cell matrix of a ROM, comprising:

a first series circuit and a second series circuit, each comprising:

a current supply means having a first main electrode connected to a power supply and a second main electrode;

a first MOS FET having a first main electrode connected to the second main electrode of said current supply means, a second main electrode and a gate electrode; and a second MOS FET having a first main electrode connected to the second main electrode of said first MOS FET, a second main electrode connected to a second power supply, and a gate electrode connected to the first main electrode of said first MOS FET;

wherein the gate electrode of said first and said second MOS FETs of said reference voltage generator are connected together;

the gate electrodes of said first MOS FETs of said first and second series circuits are connected together; and the ratio of the current driving capability between said first MOS FET of said first series circuit and said first MOS FET of said second series circuit is substantially equal to the ratio of the current driving capability between said second MOS FET of said first series circuit and said second MOS FET of said second series circuit.

DETAILED DESCRIPTION OF THE PREFERRED EMBODIMENTS

Figure 1:
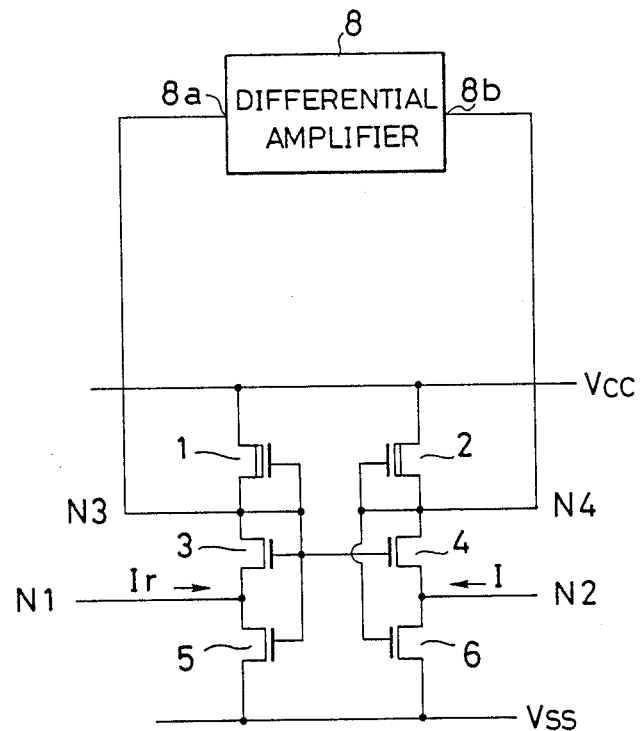
FIG. 1 is a schematic diagram of a prior art current sense circuit.
Figure 2:
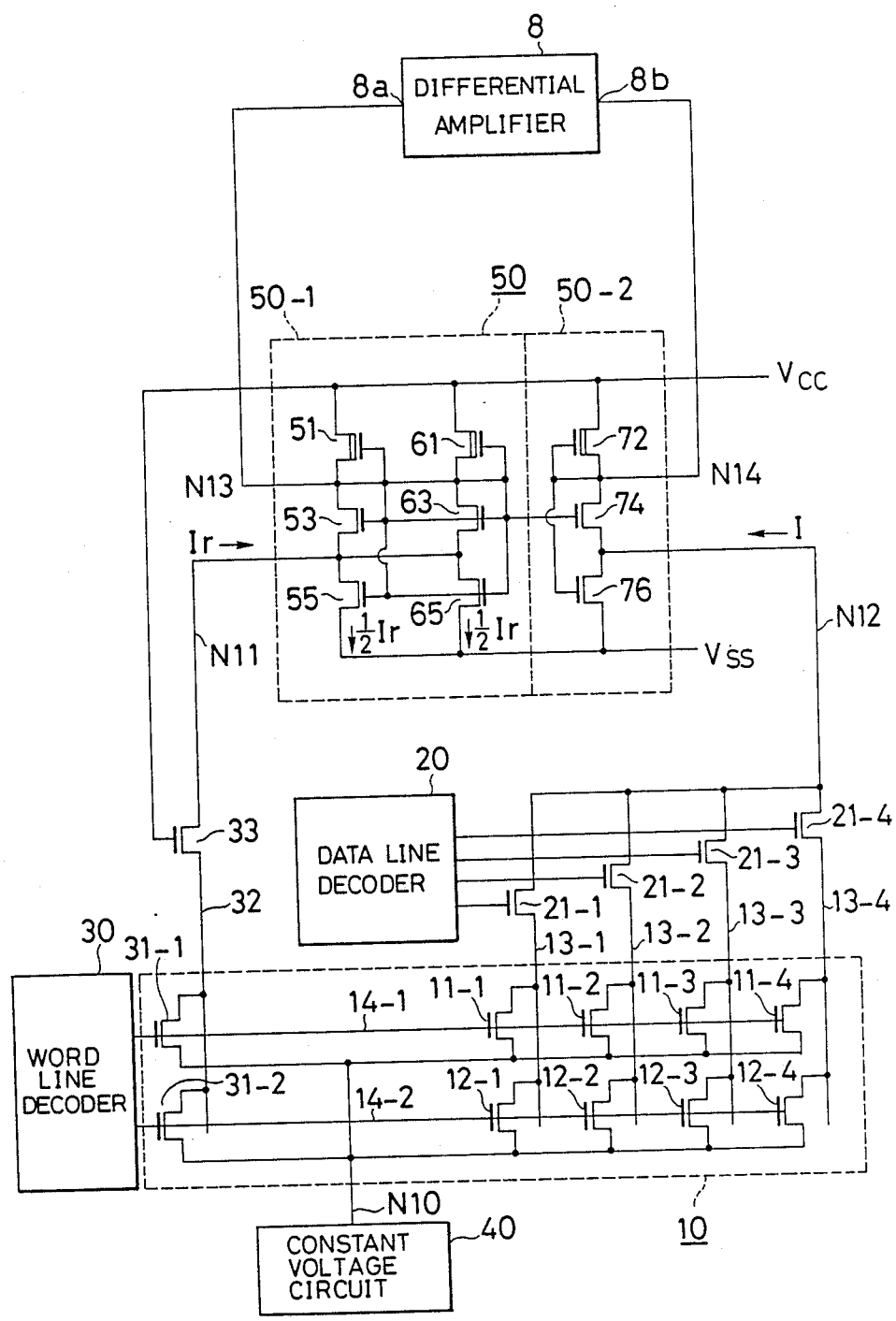
FIG. 2 is a schematic diagram of a current sense circuit according to an embodiment of the present invention, also showing an associated memory cell matrix.

An embodiment of this invention will be described with reference to FIG. 2. FIG. 2 also shows part of the memory cell matrix of an EPROM.

The ROM shown in FIG. 2 comprises a memory cell matrix 10, a data line decoder 20, a word line decoder 30 for selecting a word line, a constant-voltage circuit 40 for supplying a constant voltage (e.g., 1.5V), and a current sense circuit 50 for detecting a read current from a memory cell.

The memory cell matrix 10 comprises a plurality of memory cells 11-1, ..., 11-4, 12-1, ..., 12-4 interconnected by a plurality of data lines 13-1, ..., 13-4 and a plurality of word lines 14-1 and 14-2 in a matrix array. Each cell consists of a MOS FET, the source of which is connected to one of the data lines 13-1, ..., 13-4, the gate of which is connected to one of the word lines 14-1 or 14-2, and the drain of which is connected through a common drain node N10 to the constant-voltage circuit 40. The data lines 13-1, ..., 13-4 are connected through MOS FETs 21-1, ... 21-4 to a common node N12. The MOS FETs 21-1, ... 21-4 are driven by a data line decoder 20 so that only one of the data lines 13-1, ..., 13-4 is connected to the node N12 at a time. The word lines 14-1 and 14-2 are connected to a word line decoder 30, which is a circuit for selecting one of the word lines 14-1 and 14-2 and placing it in a high-potential state. Each of the word lines 14-1 and 14-2 is also connected to the gate of a dummy memory cell 31-1 or 31-2, the drain of which is connected to the common drain node N10 and the source of which is connected to a dummy data line 32. The dummy data line 32 is connected through a MOS FET 33 to a node N11. The dummy memory cells 31-1 and 31-2 are disposed in the memory cell matrix 10 and near the memory cells 11-4 to 11-4, and 12-1 to 12-4, respectively, which are connected to the same word lines 14-1 and 14-2, respectively. This is to ensure that the dummy memory cells 31-1 and 31-2 have closer resemblance in their characteristics and the operation conditions to the 11-1 to the memory cells 11-4 and 12-1 to 12-4 for which the dummy memory cells 31-1 and 31-2 provide a reference current, as will be described in detail later.

The number of memory cells 11-1, ..., 11-4, 12-1, .., 12-4, data lines 13-1, ..., 13-4, word lines 14-1, 14-2, ..., MOS FETs 21-1, ... 21-4, and dummy memory cells 31-1, 31-2, ... depends on the number of bits stored in the ROM and may be quite large. FIG.2 shows only part of the memory cell matrix.

The nodes N11 and N12 are connected to input terminals of the current sense circuit 50. The current sense circuit 50 comprises a current-to-voltage converting circuit 50-1 for generating a reference voltage from the input reference current Ir from node N11, and a current-to-voltage converting circuit 50-2 for converting the read current I input from node N12 to a voltage value.

The current-to-voltage converting circuit 50-1 comprises depletion-type MOS FETs 51 and 61, which serves as a resistor to supply a substantially constant current, and enhancement-type MOS FETs 53, 55, 63, and 65. The MOS FETs 51, 53, and 55 are connected in series with each other. That is the drain of the MOS FET 51 is connected to a first power supply voltage such as the high supply voltage Vcc. The source of the MOS FET 51 and the drain of the MOS FET 53 are connected together. The drain of the MOS FET 53 and the source of the MOS FET 55 are connected together. The source of the MOS FET 55 is connected to a second power supply voltage such as the low supply voltage Vss. The gates of the MOS FETs 51, 53, and 55 are connected in common to the junction between source of the MOS FET 51 and the drain of the MOS FET 53, which is connected to an output node N13. Similarly, The MOS FETs 61, 63, and 65 are connected in series with each other. That is the drain of the MOS FET 61 is connected to the high power supply voltage Vcc. The source of the MOS FET 61 and the drain of the MOS FET 63 are connected together. The drain of the MOS FET 63 and the source of the MOS FET 65 are connected together. The source of the MOS FET 65 is connected to the low power supply voltage Vss. The gates of the MOS FETs 61, 63, and 65 are connected in common to the junction between source of the MOS FET 61 and the drain of the MOS FET 63, which is connected to the output node N13.

The current-to-voltage converting circuit 50-2 comprises a series circuit consisting of a depletion-type MOS FET 72 which serves as a resistor to supply a substantially constant current, and enhancement-type MOS FETs 74 and 76, which are connected in series with the MOS FET 72. The source of the MOS FET 72 and the drain of the MOS FET 74 are connected together. The source of the MOS FET 74 and the drain of the MOS FET 76 are connected together. The drain of the MOS FET 72 is connected to the high supply voltage Vcc, and the source of the MOS FET 76 is connected to the low supply voltage Vss. The gates of the MOS FET 72 and the MOS FET 76 are connected to the junction between the source of the MOS FET 72 and the drain of the MOS FET 74, which is connected to an output node N14. The gate of the MOS FET 74 is connected to the gates of the MOS FET 63 and the MOS FET 53. The junction between the source of the MOS FET 74 and the drain of the MOS FET 76 are connected to the node N12.

The output nodes N13 and N14 are connected to the input terminals 8a and 8b of a differential amplifier 8 or a similar device. An example of such a differential amplifier 8 is shown and described in the above-mentioned U.S. Pat. No. 4,709,352, which is hereby incorporated by reference.

In the current sense circuit 50, the MOS FETs 51, 61, and 72 are identical transistors; the MOS FETs 53, 63, and 74 are identical transistors; and the MOS FETs 55, 65, and 76 are identical transistors. Furthermore, in each of the three pairs of MOS FETs 51 and 61, 53 and 63, and 55 and 65, the source, gate, and drain electrodes of both FETs in the pair are mutually interconnected, so the two MOS FETs in each pair function as a single transistor. The reason why the parallel connection of two separate transistors are used is to double the current driving capability so that the current sensing 50 as a whole compares the read current I with half the reference current Ir from the dummy memory cell. This is advantageous in that the dummy memory cell can have the same structure, the same dimensions and the same bias conditions as the memory cells, but the current sensing circuit 50 can compare the read current I, whose value can assume one of the two values depending on whether or not the information has been written in the memory cell being read, with a value intermediate between the two values. In place of the two transistors connected in parallel, a single transistor having a greater channel width (gate width) can be used. The use of the parallel connection of the two separate transistors rather than a single transistor having a greater channel width is advantageous for the following reason.

Under given bias conditions, when the channel width of a MOS FET is increased by a factor of 2, its current driving capability does not increase by precisely 2, because the current driving capability is reduced at the edges of the channel. When the channel width is small, this phenomenon in a MOS FET is known as the narrow-channel effect. To obtain precisely twice the current driving capacity in an MOS FET, it is easier to use two separate transistors with identical channel width.

If, however, the reference current Ir at the node N11 and the read current I at the node N12 are both sufficiently large that the current sense circuit 50 has an ample operating margin, it is not necessary for the MOS FET pairs 51 and 61, 53 and 63, and 55 and 65 to have precisely twice the current-driving capacity of the MOS FETs 72, 74, and 76. In this case each pair of MOS FETs can be replaced with a single MOS FET having twice the channel width and half the channel length.

The operation of the circuit in FIG. 2 will be described next.

To read the data in the memory cell 11-1, for example, address signals are supplied to the data line decoder 20 and the word line decoder 30, causing the data line decoder 20 to turn on the MOS FET 21-1 and the word line decoder 30 to place the word line 13-1 in the high-potential state. Since the MOS FET 21-1 is on, the data line 13-1 is connected to the node N12, and the data in the memory cell 11-1 causes a read current I to flow through the data line 13-1 and the MOS FET 21-1 to the input node N12 of the current-to-voltage converting circuit 50-2. Similarly, when the potential of the word line 14-1 is raised, a reference current Ir flows through the dummy memory cell 31-1, the dummy data line 32, and the MOS FET 33 to the input node N11 of the current-to-voltage converting circuit 50-1. In the current-to-voltage converting circuit 50-1, the reference current Ir is divided so that half of it flows through the MOS FET 55 and half through the MOS FET 65, causing a reference voltage to be produced at the output node N13. In the current-to-voltage converting circuit 50-2, the read current I entering at the node N12 is converted by the MOS FETs 72, 74, and 76 to a voltage which is produced at the output node N14. The difference between the output voltages at the nodes N13 and N14 is amplified by the differential amplifier 8 and becomes the data output from the ROM.

Next the operation of the current sense circuit 50 will be explained in further detail.

Due to the symmetry of the circuit configuration, the output potentials at the nodes N13 and N14 are equal when the reference current input Ir at the node N11 is twice as great as the read current I input at the node N12. Accordingly, if the reference current Ir is the same as the larger value $I_L$ of the read current I, the polarity of the potential difference between the output nodes N13 and N14 will invert at one-half the larger value $I_L$ of the read current I. Amplification of the potential difference between the nodes N13 and N14 by a device such as a differential amplifier will then provide a reliable means of reading the data.

Because the reference current Ir is produced by a dummy memory cell 13-1 or 13-2, no separate reference current generating circuit is required. Furthermore, the dummy memory cells 31-1 and 31-2 are substantially identical to the memory cells 11-1, . . . , 12-4 in their dimensions and bias conditions. Accordingly, any change in the read current I caused by fluctuations in the supply voltage Vcc will be matched by an equivalent change in the reference current Ir. This property of the ROM provides a large noise margin and prevents read-out errors even when the power supply is unstable.

Next a second embodiment of the invention will be described. This embodiment is directed toward the following improvement of the embodiment in FIG. 2. Where the reference current Ir is supplied to the node N11 through both the dummy data line 32 and the MOS FET 33, the potential of the node N11 may be unstable at the initial stage of a reading operation. As a result, the dummy memory cells 31-1 and 31-2 change the current driving capability due to voltage changes on the word lines 14-1 and 14-2. In the circuit shown in FIG. 2, reading must be delayed for a certain time after the reference current has returned to its steady state. It is desirable to hold the potential of the node N11 at a constant value in order to obtain correct data at a high rate. The second embodiment of the invention provides a solution to this problem.

Figure 3:
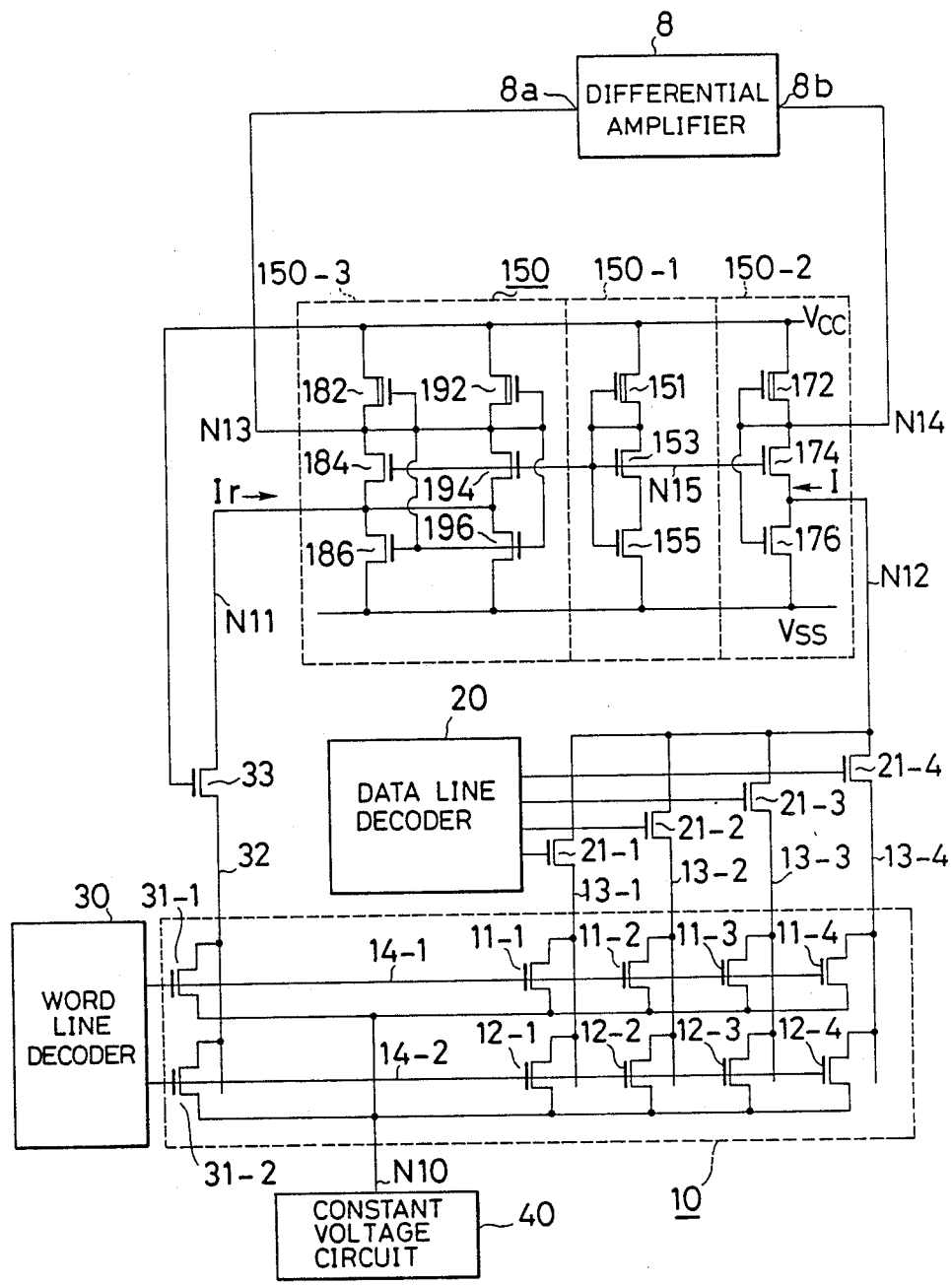
FIG. 3 is a schematic diagram of a current sense circuit according to another embodiment of the present invention, also showing an associated memory cell matrix.

FIG. 3 is a schematic diagram of a ROM having a current sense circuit according to the second embodiment of the invention. Elements identical to those in FIG. 2 are numbered with the same reference numerals. The current sense circuit, denoted by 150, of FIG. 3 differs from the current sense circuit 50 of FIG. 2 in having a reference voltage generating circuit 150-1. The current-to-voltage circuit 150-2 and 150-3 of FIG. 3 are similar to the current-to-voltage converting circuits 50-2 and 50-1 of FIG. 2, respectively.

The reference voltage generating circuit 150-1 comprises a depletion-type MOS FET 151 and enhancement-type MOS FETs 153 and 155 connected in series between the high supply voltage Vcc and the low supply voltage Vss. The gates of the MOS FETs 151, 153, and 155 and the source of the MOS FET 151 are connected in common to a node N15. The reference voltage generating circuit 150-1 provides a substantially fixed voltage at the node N15.

The first current-to-voltage converting circuit 150-2 comprises a depletion-type MOS FET 172 and enhancement-type MOS FETs 174 and 176 connected in series between the high supply voltage Vcc and the low supply voltage Vss. The gate of the MOS FET 172 is connected to the source of the MOS FET 172, the output node N14, and the gate of the MOS FET 176. The gate of the MOS FET 174 is connected through the node N15 to the gate of the MOS FET 153, and the source of the MOS FET 174 is connected to the node N12.

The second current-to-voltage converting circuit 150-3 comprises depletion-type MOS FETs 182 and 192, and enhancement-type MOS FETs 184, 186, 194, and 196. The MOS FETs 182, 184, and 186 are connected in series between the high supply voltage Vcc and the low supply voltage Vss. The MOS FETs 192, 194, and 196 are similarly connected in series between the high supply voltage Vcc and the low supply voltage Vss. The gate of the MOS FET 182 is connected to the source of the MOS FET 182, the node N13, and the gate of the MOS FET 186. The source of the MOS FET 184 and the drain of the MOS FET 186 are connected to the node N11. The gate of the MOS FET 192 is connected to the source of the MOS FET 192, and node N13, and the gate of the MOS FET 196. The gate of the MOS FET 194 is connected to the gates of the MOS FETs 153 and 184. The source of the MOS FET 194 and the drain of the MOS FET 196 are connected to the node N11. The gate of the MOS FET 196 is connected to the gate of the MOS FET 186. The MOS FETs 172, 182, and 192 are identical; the MOS FETs 174, 184, and 194 are identical; and the MOS FETs 176, 186, and 196 are identical.

Next the operation of this embodiment will be explained.

In the reference voltage generating circuit 150-1, the potential of the node N15 is determined by the high supply voltage Vcc and the characteristics of the MOS FETs 151, 153, and 155. Although for stability of operation it is desirable for the circuit configuration of the reference voltage generating circuit 150-1 to be symmetrical with the circuit configurations of the first and second current-to-voltage converting circuits 150-2 and 150-3, as will be explained below, the basic function of the potential at the node N15 is only to determine the fixed potentials at the nodes N11 and N12, so any convenient parameters can be selected for the MOS FETs 151, 153, and 155.

The first current-to-voltage circuit 150-2 operates in the same way as the current-to-voltage converting circuit 50-2 in FIG. 2. That is, in the first current-to-voltage converting circuit 150-2, since the gate voltage of the MOS FET 174 is the substantially fixed potential of the node N15, the potential at the node N12 is substantially fixed at a value of, for example, approximately 0.1V to 0.3V, and the potential at the node N14 varies in proportion to the read current I received at the node N12.

In the second current-to-voltage converting circuit 150-3, since the gate voltages of the MOS FETs 184 and 194 are the substantially fixed potential at the node N15, the node N11 is fixed at substantially the same potential as the node N12, while the potential of the node N13 varies in proportion to the reference current received at the node N11, and the coefficient of proportionality is one-half the constant of proportionality in the first current-to-voltage converting circuit 150-2.

In this embodiment, the coefficients of proportionality of the first and second current-to-voltage converting circuits 150-2 and 150-3 are in the ratio 2:1, but further sets of MOS FETs connected in series could be added to the second current-to-voltage converting circuit 150-3 to set the ratio at another value such as 3:1 or 4:1. The ratio chosen will depend on various design factors in the integrated circuit. Also, as was pointed out in the first embodiment in FIG. 2, the pairs of MOS FETs in the second current-to-voltage converting circuit 150-3 need not actually comprise separate transistors, but can consist of one transistor each.

The operation of the embodiment in FIG. 3 will be explained next.

Suppose that the data currently being read is the data in the memory cell 11-1. To switch from the memory cell 11-1 and read the data in the memory cell 12-4, for example, address signals are supplied to the data line decoder 20 and the word line decoder 30, causing the data line decoder 20 to turn off the MOS FET 21-1 and turn on the MOS FET 21-4, and the word lined decoder 30 to place the word line 13-1 in the low-potential state and the word line 13-2 in the high-potential state. The data line 13-4 is normally at the same potential of, for example, approximately 1.5V as the commondrain node N10, and holds a charge of several picocoulombs in its parasitic capacitance. Because of this charge stored in the parasitic capacitance on the data line 13-4, when the transistor 21-4 is turned one, the potential at the node N12, which has been at about 0.1 to 0.3V, rises, and the MOS FET 174 is thereby turned off. The gate voltage of the MOS FET 176 then rises quickly, and the charge stored in the data line 13-4 discharges in a short time through the low-voltage power supply Vss, after which the potential remains fixed at about 0.1 to 0.3V. In this state, a potential change proportional to the read current I received at the node N12 occurs at the node N14.

At the same time, the word line decoder 30 lowers the potential of the word line 14-1 and raises the potential of the word line 14-2, but these potential transitions do not take place instantaneously, mainly because the load charge capacitance of the word lines 14-1 and 14-2 is fairly large, and the material of which the word lines are made has a fairly large resistance. Accordingly, the drop and rise in the potentials of the word lines 14-1 and 14-2 occur simultaneously over a period of time during which time the impedances between the data line 13-4 and the dummy data line 32, and the common-drain node N10, which respectively represent the current-driving capacity of the memory cell 12-4 and the dummy memory cell 31-2, vary. As a result, the reference current Ir received from the dummy data line 32 through the MOS FET 33 at the node 11 changes over time, as does the read current I received from the data line 13-4 at the node N12. The current sense circuit 150 as a whole operates to maintain the potentials of the nodes N11 and N12. Therefore, when the potential of the word line 14-2 rises to the point at which data detection becomes possible, the correct data value can be read. Thus the circuit provides high-speed, stable readout.

The advantages of the second embodiment can be summarized as follows:

In the first embodiment, it sometimes happens that when the word line decoder 30 switches the word lines 14-1 and 14-2, the potential of the dummy data line 32 changes and it takes time for the dummy data line 32 to return to a steady state, so correct data read-out is delayed. In the second embodiment, the reference voltage generating circuit 150-1 holds the data line 32 at a fixed potential, so the data can be read out more quickly.

When the current consumption is a serious interest, the embodiment of FIG. 2 is preferred.

The scope of this invention is not limited by the embodiments shown in the drawings, but includes various obvious modifications such as, for example, the following: (i) The purpose of the depletion-type MOS FETs 51, 61, 72, 151, 172, 182, and 192 is simply to supply a substantially constant current, so they can be replaced by other circuit elements such as p-channel MOS FETs or diffusion resistors that are capable of acting as an electrical resistor. (ii) The overall circuit configuration of the ROM can be other than that shown in FIG. 2 or FIG. 3.

What is claimed is:

1. A current sense circuit for detecting a read current from a selected memory cell in a memory cell matrix of a ROM, comprising:
    a first series circuit and a second series circuit, each comprising:
        a current supply means having a first main electrode connected to a power supply and a second main electrode;

a first MOS FET having a first main electrode connected to the second main electrode of said current supply means, a second main electrode and a gate electrode; and a second MOS FET having a first main electrode connected to the second main electrode of said first MOS FET, a second main electrode connected to a second power supply, and gate electrode connected to the first main electrode of said first MOS FET;

wherein the gate electrode of said first and said second MOS FETs of said reference voltage generator are connected together;

the gate electrodes of said first MOS FETs of said first and second series circuits are connected together; and the ratio of the current driving capability between said first MOS FET of said first series circuit and said first MOS FET of said second series circuit is substantially equal to the ratio of the current driving capability between said second MOS FET of said first series circuit and said second MOS FET of said second series circuit.

2. A current sense circuit according to claim 1, wherein each of said first and second MOS FETs of said second series circuit comprise a parallel connection of MOS FETs.

3. A current sense circuit according to claim 2, wherein said first main electrode of said second MOS FET of said first series circuit is connected to the data line of the memory cell array.

4. A current sense circuit according to claim 3, wherein the first main electrode of said second MOS FET of said second series circuit is connected to the dummy data line of the memory cell array.

5. A current sense circuit according to claim 1, wherein the first main electrode of said second MOS FET of said second series circuit is connected to the dummy data line of the memory cell array.

6. A current sense circuit according to claim 1, wherein said first main electrode of said first MOS FET of said first series circuit is connected to one input of a differential amplifier and said first main electrode of said first MOS FET of said second series circuit is connected to the other input of the differential amplifier.

7. A current sense circuit according to claim 1, further comprising a reference voltage generating circuit providing a reference generator of a substantially fixed value to said gate electrodes of said first MOS FETs of said first and second series circuits.

8. A current sense circuit according to claim 7, wherein said reference voltage generating circuit comprises:

a current supply means having a first main electrode connected to a power supply and a second main electrode;

a first MOS FET having a first main electrode connected to the second main electrode of said current supply means, a second main electrode and a gate electrode; and a second MOS FET having a first main electrode connected to the second main electrode of said first MOS FET, a second main electrode connected to a second power supply, and a gate electrode connected to the first main electrode of said first MOS FET;

wherein the gate electrode of said first and said second MOS FETs of said reference voltage generator are connected together;

the gate electrodes of said first MOS FETs of said first and second series circuits are connected together; and the ratio of the current driving capability between said first MOS FET of said first series circuit and said first MOS FET of said second series circuit is substantially equal to the ratio of the current driving capability between said second MOS FET of said first series circuit and said second MOS FET of said second series circuit.

* * * * *